US006011690A

United States Patent [19]

Hughes et al.

[11] Patent Number: 6,011,690

[45] **Date of Patent: *Jan. 4, 2000**

[54] PC CARD WITH THERMAL MANAGEMENT

[75] Inventors: James G. Hughes, Simi Valley; John N. Otey, Hidden Hills; Son Nam Doan, West Hills, all of Calif.

[73] Assignee: Xircom, Inc., Thousand Oaks, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/880,488

[22] Filed: Jun. 23, 1997

[51] Int. Cl.[7] .......... H05K 7/20

[52] U.S. Cl. .......... 361/704; 361/737; 361/816; 174/52.1; 235/492; 257/707; 257/628

[58] Field of Search .......... 361/704, 737, 361/387, 684, 818, 816, 688, 706, 716, 728, 736, 752, 786, 772, 785, 789; 439/76.1, 62, 449, 629, 651; 174/52.2, 52.1, 260; 395/282; 363/87; 235/492, 487; 165/80.2, 80.3, 80.4, 121, 104.32, 104.33, 185

[56] References Cited

U.S. PATENT DOCUMENTS

| | | | |
|---|---|---|---|
| 5,208,732 | 5/1993 | Baudouin et al. | 361/704 |
| 5,414,253 | 5/1995 | Baudouin et al. | 235/492 |
| 5,590,026 | 12/1996 | Warren et al. | 361/704 |
| 5,596,486 | 1/1997 | Young et al. | 361/704 |
| 5,625,228 | 4/1997 | Rogren | 361/704 |
| 5,854,874 | 12/1998 | Yatsugi et al. | 386/118 |

*Primary Examiner*—Leo P. Picard
*Assistant Examiner*—Michael Datskovsky
*Attorney, Agent, or Firm*—Loeb & Loeb LLP

[57] ABSTRACT

A PC card comprising a housing including top and bottom cover panels encloses at least one heat-generating circuit component, typically an IC device or package. A heat spreading element, which may be in the form of a copper sheet, is disposed in conduction heat transfer relationship with the at least one circuit component and at least one of the housing covers, the heat spreading element being adapted to receive heat from the at least one circuit component, to spread the heat uniformly and to transfer it to the at least one housing cover panel. From there, the heat is dissipated into the surrounding environment.

12 Claims, 2 Drawing Sheets

10 22a 22 28 26 18 20 24 14 16

PC CARD WITH THERMAL MANAGEMENT

FIELD OF THE INVENTION

This invention relates generally to removable PC cards of the type used with personal computers, peripherals and other electronic apparatus, and particularly to improved PC card constructions enhancing the dissipation of heat produced by circuit components enclosed within the card.

BACKGROUND OF THE INVENTION

Many of today's laptop, notebook, desktop and other personal computers, as well as computer peripherals and other electronic products, have receptacles or ports for receiving removable personal computer (PC) cards. Such cards typically conform to software, hardware and form factor standards established by the Personal Computer Memory Card International Association (PCMCIA).

PC cards may be used for various purposes. For example, they can supplement the semiconductor or disk memory of a personal computer, or can be used as a communications link or to store information or data for use by the host system or for reconfiguring the host system in response to information stored in the integrated circuit devices carried by the PC card.

A typical PC card includes a housing comprising a pair of opposed sheet stainless steel cover panels mechanically or adhesively secured to a plastic frame and to front and rear connector bodies. The housing encloses a printed circuit board assembly typically supporting a variety of circuit components including one or more integrated circuit devices. These integrated circuit devices may dissipate substantial electrical power, for example, two watts or more, causing the IC devices to exceed their maximum case temperature rating of, for example, 70° C.

Accordingly, an overall object of the present invention is to provide for sufficiently rapid heat transfer from the heat-producing integrated circuit devices to the ambient environment so as to maintain the devices within their normal operating temperature ranges.

SUMMARY OF THE INVENTION

In accordance with the broader aspects of the present invention, there is provided a PC card comprising a housing including top and bottom cover panels and at least one heat-generating circuit component, typically an IC device or package, enclosed within the housing. A heat spreading element is disposed in heat transfer relationship with the at least one circuit component and at least one of the housing covers, the heat spreading element being adapted to receive heat from the at least one circuit component, to spread the heat uniformly and to transfer it to the at least one housing cover panel. From there, the heat is dissipated into the surrounding environment.

In accordance with one specific, exemplary embodiment of the invention, the heat spreading element is in the form of a sheet, preferably made of copper, bonded to the inside surface of the top cover panel of the PC card. The cover panel is typically made of sheet stainless steel, a material having a relatively high thermal resistance. The copper sheet conducts the heat generated by the small area IC device and distributes it evenly across its entire surface area with a much lower thermal resistance than the stainless steel. The copper sheet then conducts the heat to the entire surface of the stainless steel again with low temperature resistance to the outer stainless steel surface where the heat is ultimately transferred to the surrounding air. This results in a much lower overall thermal resistance path from the heat generating IC device to the ambient environment and results in lower IC device temperatures than can be achieved with stainless steel covers alone. The result is that the IC devices are maintained within their normal operating temperature range.

BRIEF DESCRIPTION OF THE DRAWINGS

Further objects, features and advantages of the invention will become evident from the detailed description below when read in conjunction with the accompanying drawings in which.

DETAILED DESCRIPTION OF THE PREFERRED EMBODIMENTS

Figure 1:
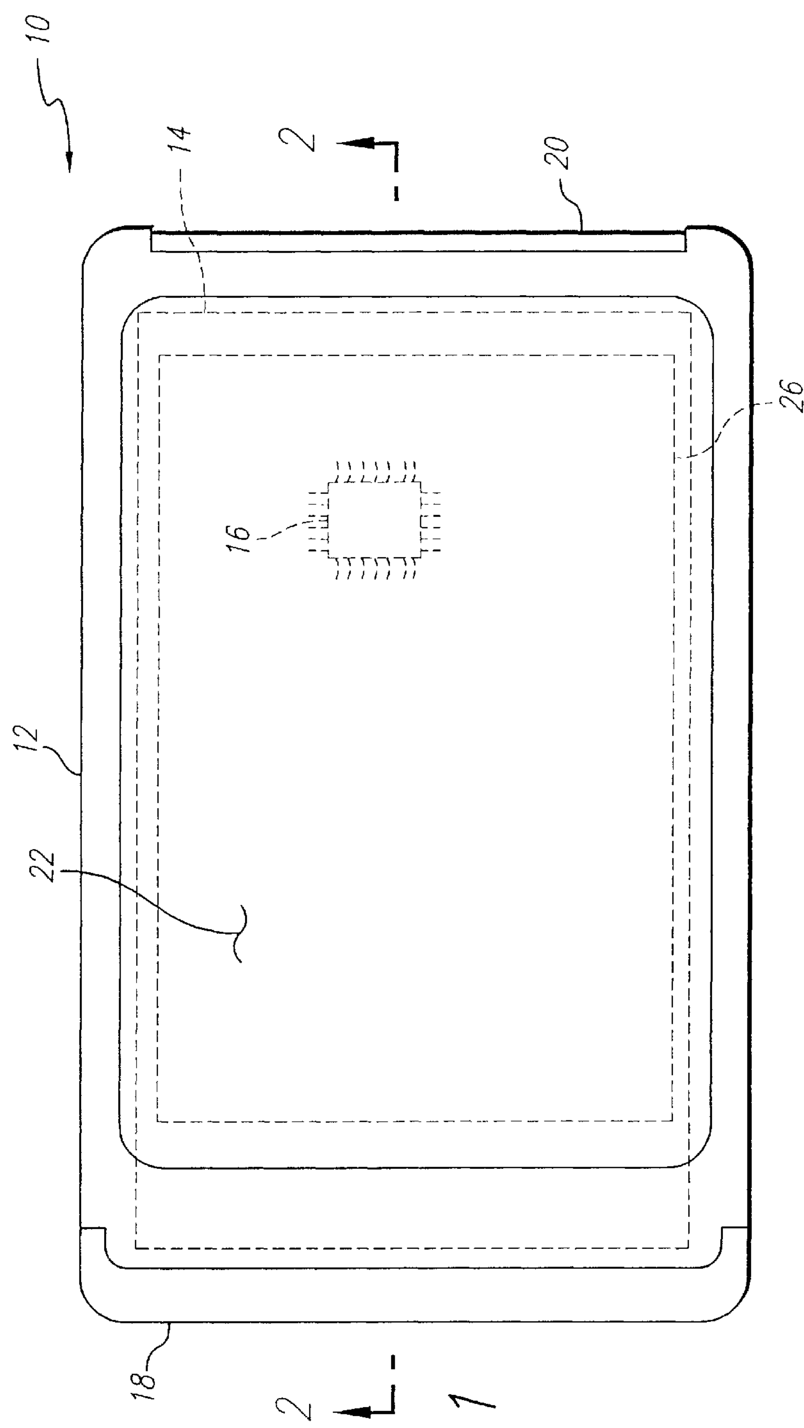
FIG. 1 is a top plan view of a PC card in accordance with the invention.

It will be evident that in the drawings, the thicknesses of the sheet metal and other components have been exaggerated for the sake of clarity.

Referring to FIGS. 1–4 of the drawings, there is shown a PC card 10 comprising generally a housing 12 enclosing a printed circuit board (PCB) 14. The PCB 14 carries a variety of circuit components typically including at least one integrated circuit device or package 16 having an upper, planar surface 16*a*. The nature and placement on the PCB of the various circuit components are well known in the art. The PC card 10 includes a front connector assembly 18 and a rear end piece 20. The PC card housing 12 comprises generally parallel, opposed top and bottom sheet stainless steel cover panels 22 and 24, respectively. The top cover panel 22 has an inner surface 22*a*.

The PC card 10 may interact with, and/or supplement the functions of, a host apparatus in a variety of ways depending upon the function of the card. For example, where the PC card 10 serves as a communications link, the rear end piece 20 may be in the form of an I/O connector module including a connector body having a port for receiving a communications cable (not shown).

As is well known in the art, the IC packages carried by the PCB produce heat during operation. IC devices that dissipate high levels of electrical power, for example, two watts or more, can cause these devices to exceed their maximum case temperature ratings of, for example, 70° C. Stainless steel, having a relatively low thermal conductivity, does not dissipate or spread heat efficiently from concentrated thermal sources. In accordance with the present invention, using conduction heat transfer, the heat generated by the IC devices carried by the PCB is transferred away from the device at an augmented rate, spread uniformly, and ultimately dissipated into the ambient environment.

Figure 2:
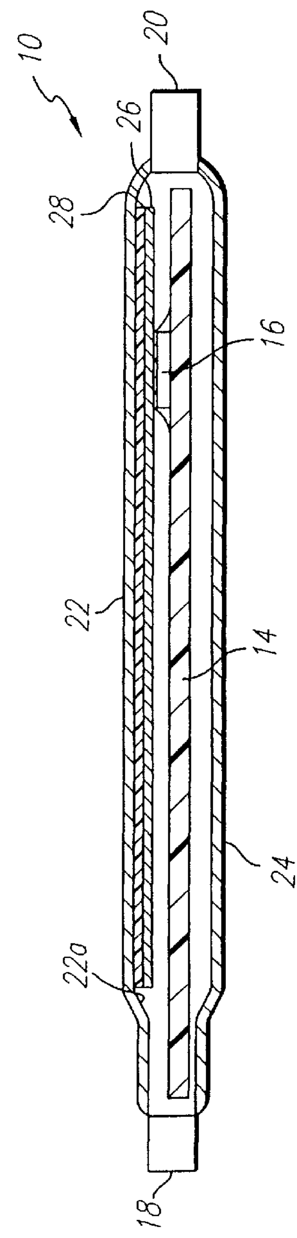
FIG. 2 is a cross section view of the PC card of FIG. 1 as seen along the line 2—2.
Figures 3, 4:
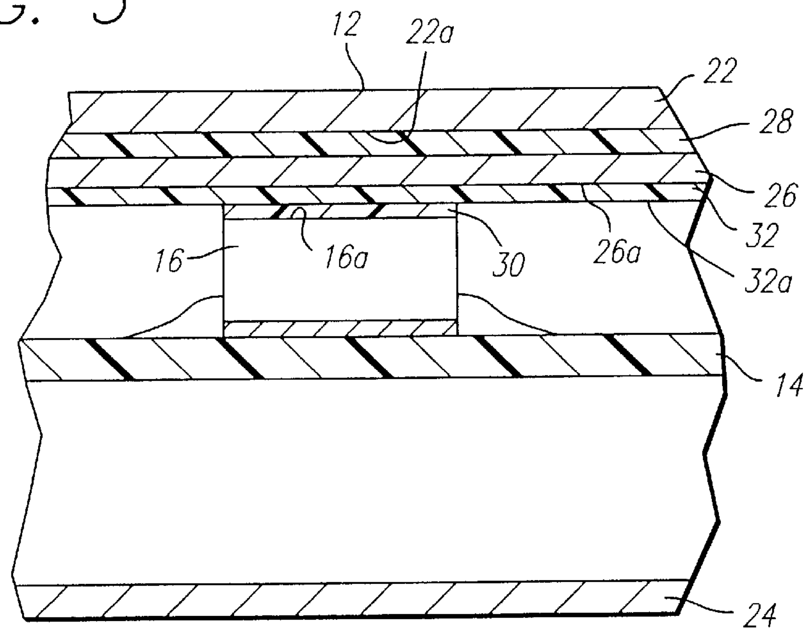
FIG. 3 is in enlargement of a portion of the cross sectional view of FIG. 2.
FIG. 4 is a side elevation view, in cross section, along the lines of FIG. 3, showing a portion of a PC card in accordance with an alternative embodiment of the present invention.

In accordance with a first, preferred embodiment of the invention, shown in FIGS. 1–3, there is provided within the PC card housing 12 a heat spreading element 26 interposed between the upper surface 16*a* of the IC device 16 and the inner surface 22*a* of the top stainless steel cover panel 22. The heat spreading element 26 may take the form of a sheet of copper, aluminum or other high thermal conductivity material. The element 26 provides a means for moving heat generated by the IC device uniformly to the entire surface of the stainless steel top cover 22 from where it is dissipated to the surrounding atmosphere. The element 26 is in heat transfer relationship with both the inner surface 22*a* of the top cover panel 22 and the upper surface 16*a* of the integrated circuit device 16. Specifically, the element 26 is joined to the inner surface 22*a* of the top stainless steel cover panel 22 by means of a conductive bonding agent 28 such as a thermally conductive pressure sensitive adhesive. The element 26 may be conveniently made from commercially available adhesive coated, 3-mil thick copper film.

A thermally conductive compound 30, such as Visiloc 742, is interposed between and in contact with the inner surface 26*a* of the element 26 and the upper surface 16*a* of the IC device 16. The compound 30 functions as a heat transfer bridge between the IC device 16 and the element 26. Thus, heat travels from the device 16 through the thermal compound 30 to the element 26 which spreads the heat efficiently and uniformly. From the element 26, the heat passes through the thermally conductive pressure sensitive adhesive 28, the stainless steel cover panel 22 and from there to the ambient environment. It will thus be seen that the invention utilizes conduction heat transfer to efficiently dissipate to the ambient environment heat generated by an IC device within a PC card.

As an alternative to the foregoing, a thin insulating film 32 may be applied to the inner surface 26*a* of the heat spreading element 26. In this case, the thermally conductive compound 30 will be interposed between, and in contact with, the inner surface 32*a* of the insulating film 32 and the upper surface 16*a* of the IC device 16. The insulating film serves to electrically insulate the electrical components carried by the PCB 14 from the heat spreading element 26. By way of example, the insulating film 32 may comprise polyester Mylar, 0.002 inch thick, and may be applied to substantially the entire inner surface 26*a* of the element 26 or only to that portion of the surface 26*a* facing the electrical components on the PCB 14.

FIG. 4 shows an alternative embodiment of the present invention. This embodiment comprises a PC card 40 having top and bottom cover panels 42 and 44, respectively, a PCB 46 and at least one heat-producing IC device 48 mounted on the PCB 46. In place of the copper sheet of the first embodiment, the top PC card cover panel 42 is fabricated of copper clad stainless steel stock. More specifically, copper cladding 50 forms the inner surface of the top cover panel 42. Again, thermal conduction between the IC device 48 and the top cover panel 42 is provided by a thermally conductive compound 52 interposed between the upper surface of the IC device 48 and the copper cladding 50 of the top cover panel 42.

As an alternative to the aforedescribed copper cladding 50, a copper layer may be plated or otherwise coated or deposited on the inner surface of the top stainless steel cover panel 42. In any case, whether in the form of a discrete sheet or in the form of cladding, plating, or other coating, these elements serve as low thermal resistance heat spreaders for receiving the heat generated by the IC device 48 and spreading it uniformly over substantially the entire area of the stainless steel cover from where the heat is readily dissipated into the surrounding atmosphere. As a further modification, a thin insulating film 54 similar to the film 32 shown in FIG. 3, may be applied to the inner face of the heat spreading copper cladding 50 (or alternative copper layer) so as to electrically insulate the electrical components carried by the PCB 46 from the copper cladding 50 or alternative copper layer.

In summary, stainless steel PC card cover panels associated with a high thermally conductive heat spreader element allows higher power dissipation and higher power density (watts per square inch) than stainless steel by itself thereby preventing the IC devices from exceeding their maximum temperature ratings.

While the present invention has been described with reference to particular illustrative embodiments, the invention is not intended to be restricted to those embodiments but only by the appended claims. It will be appreciated that those skilled in the art can change or modify the described embodiments without departing from the scope and spirit of the invention.

What is claimed is:

1. A PC Card adapted to be received by a standard PCMCIA port in a host system, the PC Card including a transverse front end carrying a connector adapted to be received by a corresponding connector within the port of the host system, the PC Card comprising:

a housing including parallel top and bottom covers of a material having a first thermal conductivity;

a substrate enclosed within the housing, the substrate having top and bottom surfaces, the substrate being disposed between the top and bottom covers and carrying at least one circuit component on at least one of said substrate surfaces, the at least one circuit component generating heat during operation; and a heat spreading element having a second thermal conductivity disposed in heat transfer relationship with the at least one circuit component and at least one of the housing covers, said second thermal conductivity being higher than said first thermal conductivity, said heat spreading element conducting and spreading heat generated by the at least one circuit component along the heat spreading element away from the at least one circuit component and to transferring the heat so spread to the at least one housing cover for dissipation to the ambient environment, the heat spreading element spreading heat substantially uniformly over substantially the entire area of the at least one housing cover.

2. A PC Card, as defined in claim 1, in which:

the housing covers comprise sheet stainless steel; and the heat spreading element comprises a sheet of copper.

3. A PC Card, as defined in claim 2, in which:

the at least one housing cover comprises copper clad stainless steel, the copper cladding comprising the head spreading element.

4. A PC Card, as defined in claim 2, in which:

the at least one housing cover comprises copper plated stainless steel, the copper plating comprising the heat spreading element.

5. A PC Card, as defined in claim 1, further including:

an electrically insulating film interposed between the heat spreading element and the at least one circuit component.

6. A PC Card, as defined in claim 5, further including:

a conductive bonding agent joining the insulating film and the at least one circuit component.

7. A PC Card adapted to be received by a standard PCMCIA port in a host system, the PC Card including a transverse front end carrying a connector adapted to be received by a corresponding connector within the port of the host system, the PC Card comprising:

a housing including parallel top and bottom covers of sheet stainless steel;

a substrate enclosed within the housing, the substrate having top and bottom surfaces, the substrate being disposed between the top and bottom covers and carrying at least one circuit component on at least one of said substrate surfaces, the at least one circuit component generating heat during operation; and a heat spreading element comprising a sheet of copper disposed in heat transfer relationship with the at least one circuit component and at least one of the housing covers, said heat spreading element conducting and spreading heat generated by the at least one circuit component along the heat spreading element away from the at least one circuit component and to transferring the heat so spread to the at least one housing cover for dissipation to the ambient environment.

8. A PC Card, as defined in claim 7, in which:

the heat spreading element spreads heat substantially uniformly over substantially the entire area of the at least one housing cover.

9. A PC Card, as defined in claim 7, in which:

the at least one housing cover comprises copper clad stainless steel, the copper cladding comprising the heat spreading element.

10. A PC Card, as defined in claim 7, in which:

the at least one housing cover comprises copper plated stainless steel, the copper plating comprising the heat spreading element.

11. A PC Card, as defined in claim 7, further including:

an electrically insulating film interposed between the heat spreading element and the at least one circuit component.

12. A PC Card, as defined in claim 11, further including:

a conductive bonding agent joining the insulating film and the at least one circuit component.

* * * * *